(12) United States Patent
Leng et al.

(10) Patent No.: US 9,679,844 B2
(45) Date of Patent: Jun. 13, 2017

(54) MANUFACTURING A DAMASCENE THIN-FILM RESISTOR

(71) Applicant: Microchip Technology Incorporated, Chandler, AZ (US)

(72) Inventors: Yaojian Leng, Portland, OR (US); Justin Hiroki Sato, West Linn, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/184,748

(22) Filed: Jun. 16, 2016

(65) Prior Publication Data

US 2016/0372420 A1 Dec. 22, 2016

Related U.S. Application Data

(60) Provisional application No. 62/181,515, filed on Jun. 18, 2015.

(51) Int. Cl.
| | |
|---|---|
| *H01L 21/321* | (2006.01) |
| *H01L 23/522* | (2006.01) |
| *H01L 21/768* | (2006.01) |
| *H01L 49/02* | (2006.01) |
| *H01L 23/532* | (2006.01) |

(52) U.S. Cl.
CPC .... *H01L 23/5228* (2013.01); *H01L 21/76849* (2013.01); *H01L 23/5226* (2013.01); *H01L 23/53228* (2013.01); *H01L 28/24* (2013.01)

(58) Field of Classification Search
CPC ............... H01L 23/522; H01L 23/5228; H01L 23/5226; H01L 23/532; H01L 23/53228

USPC ......................................................... 438/384
See application file for complete search history.

(56) References Cited

U.S. PATENT DOCUMENTS

| 7,410,879 B1 | 8/2008 | Hill et al. ...................... 438/384 |
| 2002/0037643 A1 | 3/2002 | Ishimaru ....................... 438/642 |
| 2003/0010751 A1 | 1/2003 | Wu ............................... 216/105 |
| 2010/0155893 A1 | 6/2010 | Chen et al. .................... 257/537 |
| 2013/0093056 A1 | 4/2013 | Kim ............................... 257/536 |
| 2016/0218062 A1* | 7/2016 | Aggarwal ........... H01L 23/5228 |

OTHER PUBLICATIONS

International Search Report and Written Opinion, Application No. PCT/US2016/038012, 14 pages, Oct. 19, 2016.

* cited by examiner

*Primary Examiner* — Selim Ahmed
(74) *Attorney, Agent, or Firm* — Slayden Grubert Beard PLLC

(57) ABSTRACT

In some embodiments of the present disclosure, a method for manufacturing a thin film resistor after completing a copper chemical mechanical polishing (CMP) process on a copper process module may include: depositing a dielectric barrier layer across at least two structures; depositing a second dielectric layer atop the dielectric barrier as a hard mask; patterning a trench using photo lithography; etching the trench through the hard mask and stopping in or on the dielectric barrier; removing any remaining photoresist from the photo lithography process; etching the trench through the dielectric barrier thereby exposing a copper surface for each of the at least two copper structures; and depositing thin-film resistor material into the trench and bridging across the resulting at least two exposed copper surfaces.

9 Claims, 7 Drawing Sheets

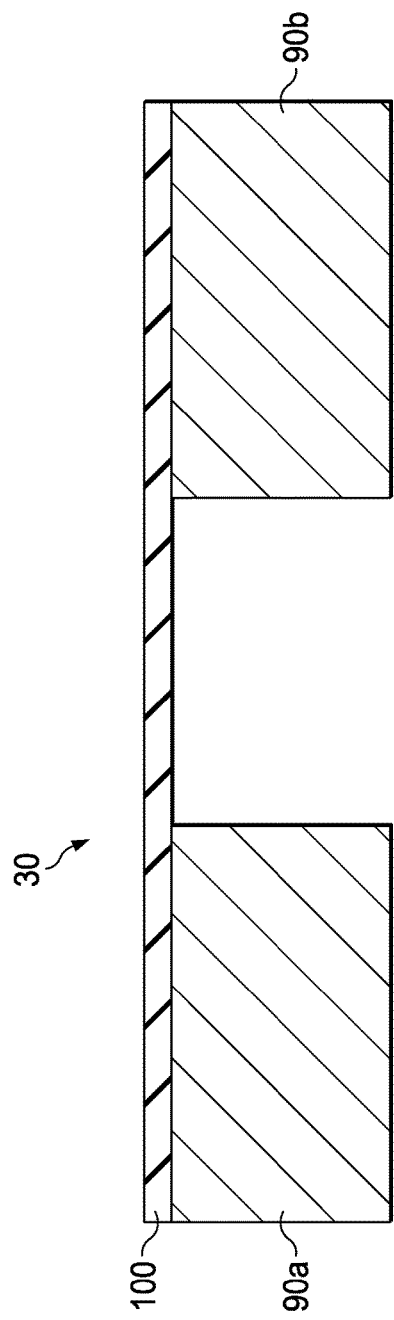
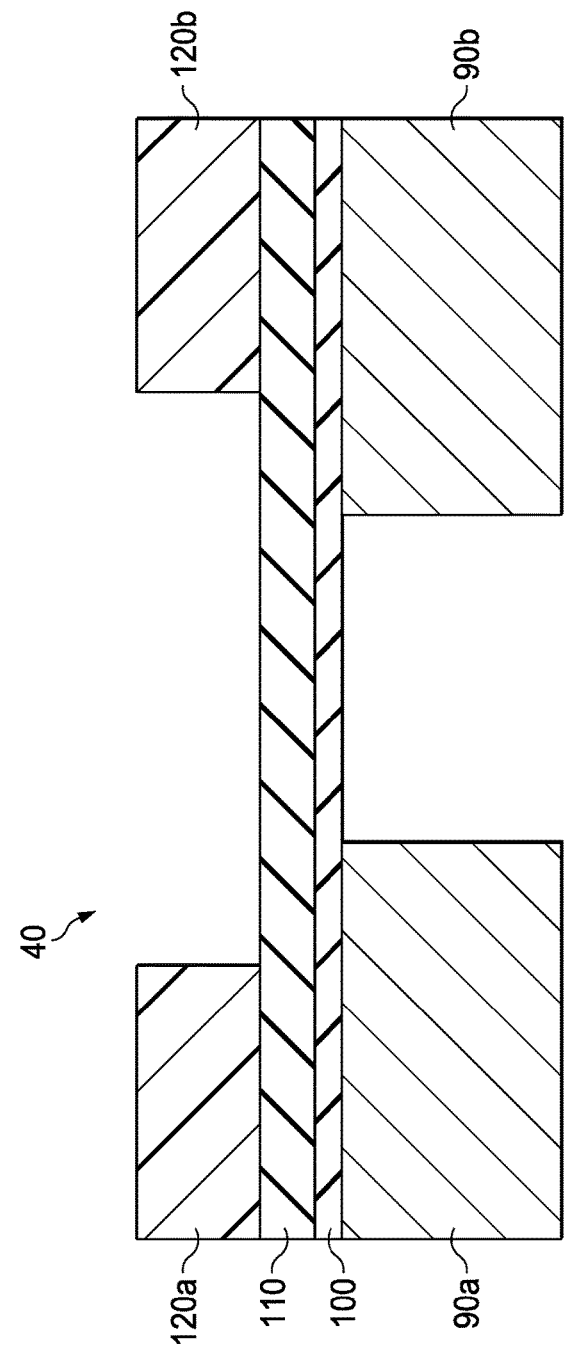

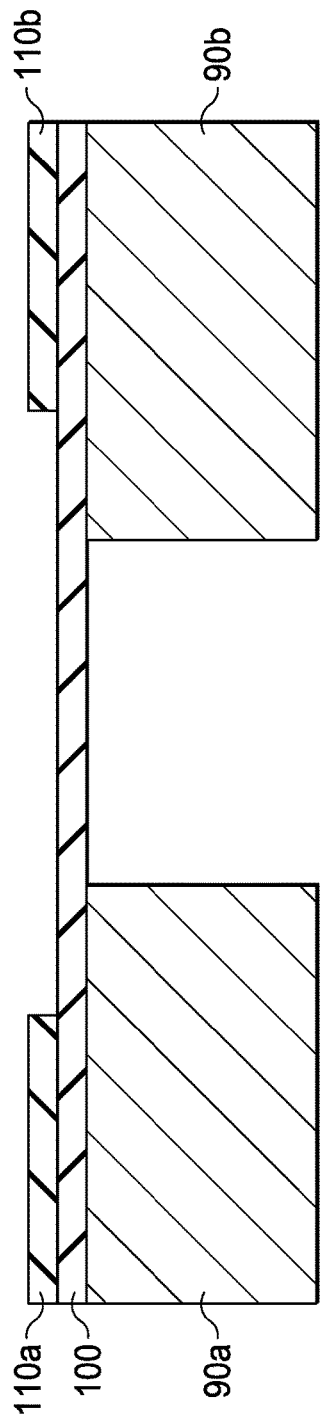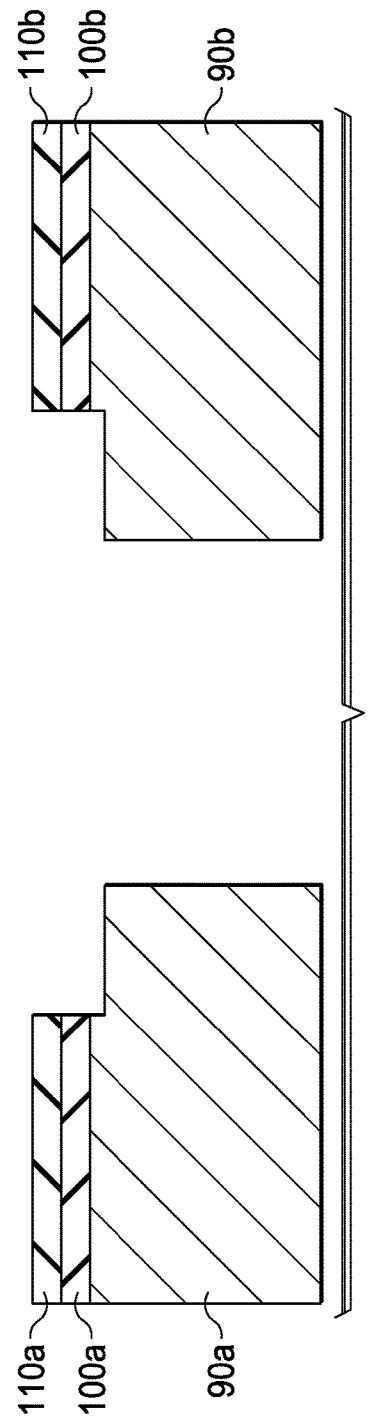

MANUFACTURING A DAMASCENE THIN-FILM RESISTOR

CROSS-REFERENCE TO RELATED APPLICATIONS

This application claims priority to commonly owned U.S. Provisional Patent Application No. 62/181,515 filed Jun. 18, 2015, which is hereby incorporated by reference herein for all purposes.

TECHNICAL FIELD

The present disclosure relates to a damascene thin-film resistor, in particular a Damascene thin-film resistor module built with a single added mask layer on a copper back-end of line (BEOL) processing of a semiconductor device and a method for manufacturing such a device.

BACKGROUND

Semiconductor integrated circuits (IC) typically include metallization layers used to connect various components of the IC, called interconnect, or back end of line (BEOL). Copper may be preferred over aluminum due to its lower resistivity and high electro-migration resistance. Copper interconnect, however, is difficult to manufacture with traditional photoresist masking and plasma etching used for aluminum interconnect.

One known technique for forming copper interconnects on an IC is known as additive patterning, sometimes called a Damascene process, which refers to traditional metal inlaying techniques. A so-called Damascene process may include patterning dielectric materials, such as silicon dioxide, or fluorosilicate glass (FSG), or organo-silicate glass (OSG) with open trenches where the copper or other metal conductors should be. A Copper diffusion barrier layer (typically Ta, TaN, or bi-layer of both) is deposited, followed by a deposited Copper seed layer. It is usually followed by the bulk Copper fill, typically through Electro-Chemical Plating process. Chemical-mechanical planarization (CMP) process is then used to remove any excessive copper and barrier. This CMP process is typically referred as Copper CMP process. The copper remaining in the trench then functions as a conductor. Typically, the wafer is immediately deposited with a dielectric barrier layer, such as SiN or SiC to prevent Copper corrosion and improve device reliability.

With more features packed into a semiconductor chip, there is more need to pack passive components, such as resistors, into the circuits. Some resistors can be created through ion implantation and diffusion, such as poly resistors. However, such resistors have high variations in its resistance value, and also its resistance value changes drastically with temperature.

SUMMARY

According to various embodiments, example methods provide a low-cost BEOL thin-film resistor (TFR) compatible with existing copper interconnect processes. Also, example methods require fewer photo lithography masks, simplifying the process and reducing the cost. It provides significant cost saving over typical thin-film resistor with three added mask layers. The module is flexible, and can be inserted into any metal layer of Copper interconnect.

Various embodiments provide methods to construct thin-film resistors on a copper BEOL semiconductor device. A resistor with well controlled resistivity is manufactured in the BEOL, using a thin conductive film, called Thin-Film Resistor (TFR). The materials used to construct TFR typically have close to 0 Temperature Coefficient of Resistance (TCR). Such TFR provides accurate and stable resistance value over wide range of temperature, enhances the chip performance significantly, particularly for precision analog circuits where matching is critical.

It is modular, and can be inserted into any metal layers of Copper damascene interconnect after Copper CMP and dielectric barrier deposition. The module can be inserted once or multiple times into the multi-level Copper interconnects.

Thin Film Resistors with a sheet resistance on the order of ~1KΩ/□ and Temperature coefficient of Resistance (TCR) close to 0 allow new designs of integrated circuits, particularly with analog components. As more and more analog components are integrated into a single chip, the need to create a TFR module with competitive cost is growing.

In some embodiments of the present disclosure, a method for manufacturing a thin film resistor after completing a Copper chemical mechanical polishing (CMP) process on a copper process module may include: depositing a dielectric barrier layer across at least two structures; depositing a second dielectric layer atop the dielectric barrier as a hard mask; patterning a trench using photo lithography; etching the trench through the hard mask and stopping in or on the dielectric barrier; removing any remaining photoresist from the photo lithography process; etching the trench through the dielectric barrier thereby exposing a copper surface for each of the at least two copper structures; and depositing thin-film resistor material into the trench and bridging across the resulting at least two exposed copper surfaces.

Some embodiments may include capping the thin-film with a dielectric film.

In some embodiments, the dielectric film is silicon dioxide.

In some embodiments, a cleaning step is performed after the TFR trench etching.

In some embodiments, the cleaning step is a diluted HF clean configured to remove etch residue from the surface of the wafer.

In some embodiments, the thin-film material is TaN, SiCr, or SiCCr.

In some embodiments, the thin-film material is selected from the group consisting of TaNx, CrSi, NiCr, TiNx, SiCr, SiCCr, Ta, Cr, Ti, W, and Mo.

Some embodiments may include polishing off any protruding materials outside TFR trenches, including TFR dielectric cap, TFR material, and/or some or all of the remaining hard mask with a new CMP process after the thin-film resistor material has been deposited into the trench.

Some embodiments may include continuing a copper damascene process after the completion of the second CMP to connect the at least two separated copper structures to other structures on the wafer using vias.

BRIEF DESCRIPTION OF THE DRAWINGS

FIG. 3 is a drawing showing an IC stack after portions of a method for building a TFR have been completed according to the teachings of the present disclosure.

FIG. 4 is a drawing showing an IC stack after portions of a method for building a TFR have been completed according to the teachings of the present disclosure.

FIG. 6 is a drawing showing an IC stack after portions of a method for building a TFR have been completed according to the teachings of the present disclosure.

FIG. 7 is a drawing showing an IC stack after portions of a method for building a TFR have been completed according to the teachings of the present disclosure.

The figures provide illustrations of various embodiments of the teachings of the present disclosure. A person having ordinary skill in the art will be able to use the teachings of the present disclosure to develop alternative embodiments of the structures and methods depicted in the figures without departing from the scope of the claims or the teachings of the present disclosure.

DETAILED DESCRIPTION

Figure 1:
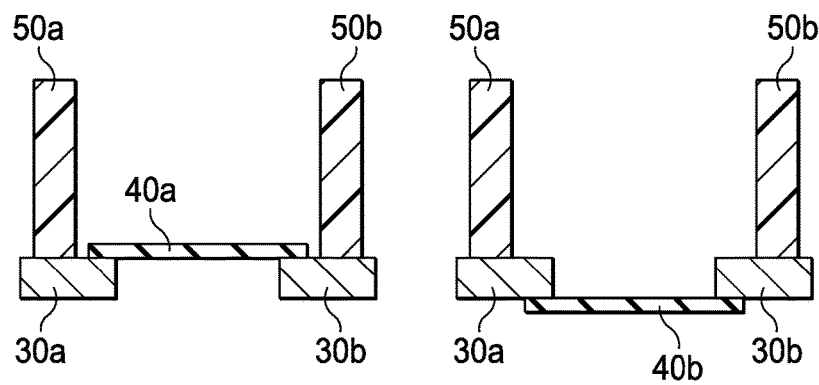
FIG. 1 is a drawing showing two example thin film resistors (TFRs) implemented with conventional processes.

FIG. 1 is a drawing showing two example TFRs implemented with conventional processes. The TFRs shown in FIG. 1 require three added mask layers for fabrication. To wit, a first added mask layer is needed to create the TFR heads 30a and 30b. A second added mask layer is needed to create the TFRs 40a and 40b. A third added mask layer is needed to create TFR vias 50a and 50b. The two example TFRs 40a and 40b shown may be built across the top of the TFR heads 30a and 30b or underneath, but in both cases there are at least three added mask layers required.

Figure 2:
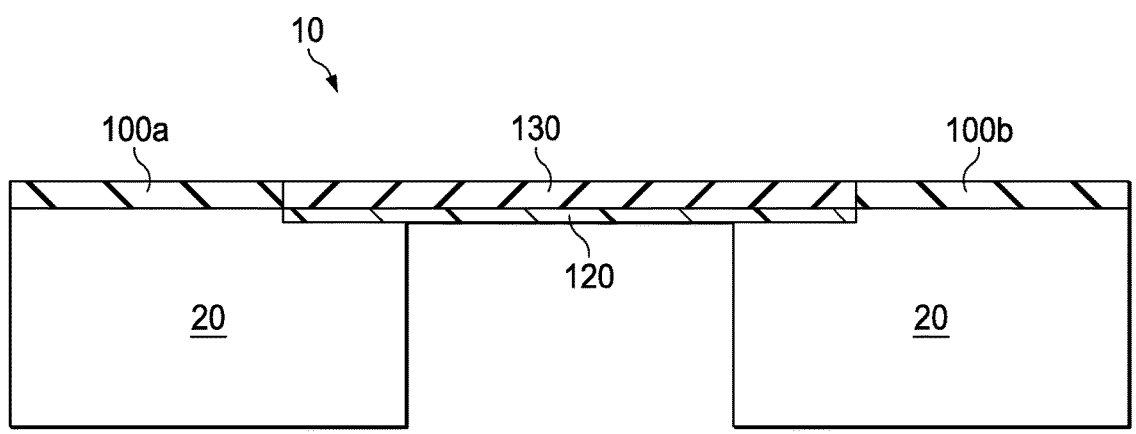
FIG. 2 is a drawing showing an example TFR deposited according to the teachings of the present disclosure.

FIG. 2 is a drawing showing an example TFR 120 deposited on an IC 10 according to the teachings of the present disclosure. According to various embodiments, TFR module 120 can be created using only one mask layer and one mask process. TFR 120 may be deposited into trenches patterned into a previously processed semiconductor substrate 20, comprising any appropriate known substrate materials and semiconductor processes. As shown, TFR 120 may be a conductive interconnect between features isolated by a dielectric barrier layer 100a, b. In some embodiments, a dielectric layer 130 may fill any spaces left by the TFR processes.

Figure 11:
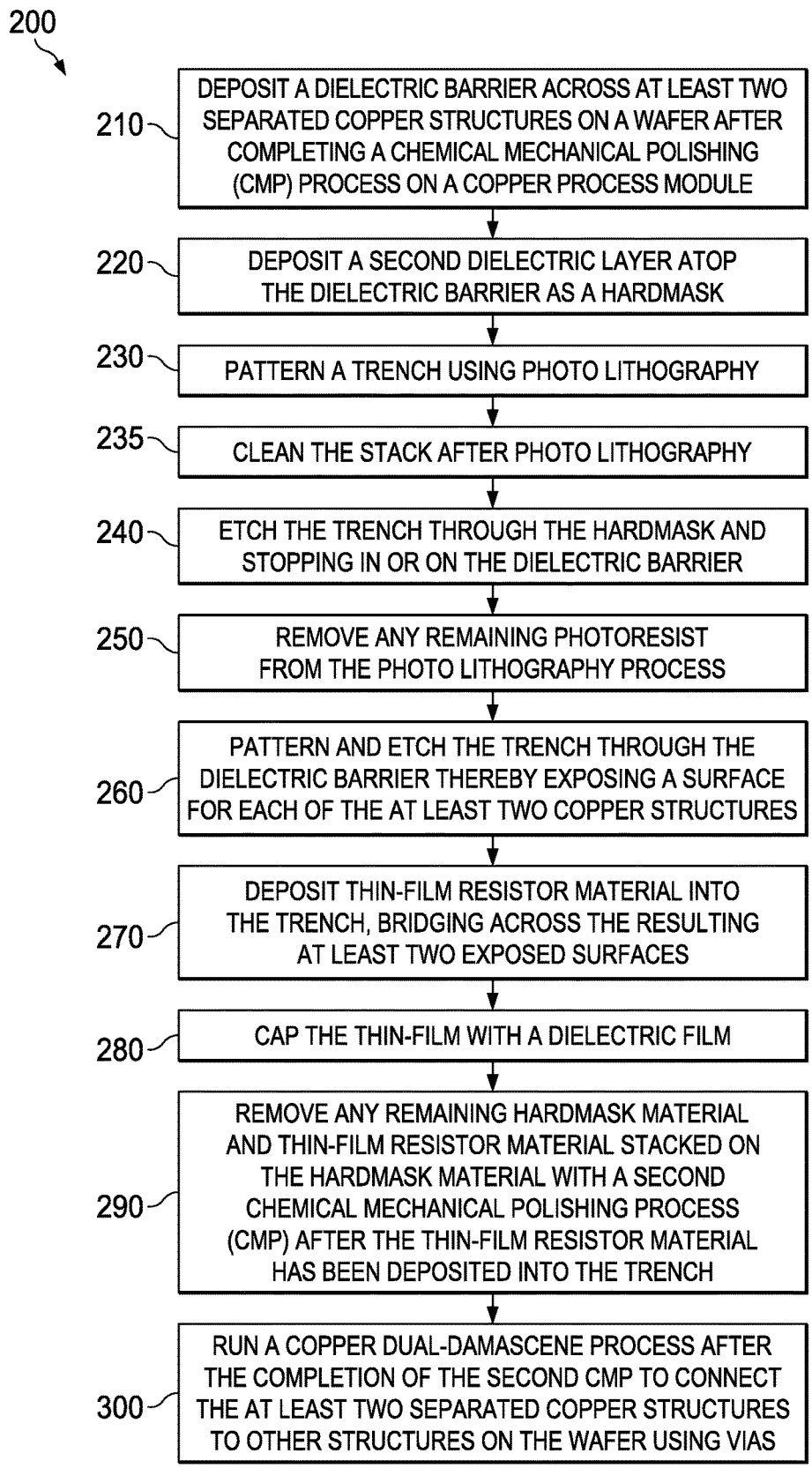
FIG. 11 is a flowchart showing an example method for manufacturing a thin film resistor after completing a Copper chemical mechanical polishing (CMP) process on a copper process module, according to teachings of the present disclosure.

FIG. 3 is a drawing showing an IC stack 30 after portions of a method 200 for building a TFR have been completed according to the teachings of the present disclosure (method 200 is discussed in more detail in relation to FIG. 11). At the stage shown in FIG. 3, stack 30 includes a layer of dielectric barrier 100 deposited to encapsulate all the copper surfaces including in this example, 90a and 90b. The dielectric barrier layer 100 is typically SiN or SiC, with the thickness on the order of ~500 Angstrom.

FIG. 4 is a drawing showing an IC stack 40 after portions of the method 100 for building a TFR have been completed according to the teachings of the present disclosure. As shown in FIG. 4, stack 40 includes a second dielectric layer 110 deposited atop the dielectric barrier layer 100 to act as a hard mask for the following etch operation. The second layer 110 may be referred to as a hard mask, and can be composed of Silicon Dioxide. This second layer 110 must be different in nature than the barrier 100, as the selectivity between the two films is critical. A trench has been patterned using photo lithography into photoresist 120 (leaving photoresist 120a, b). The trench is wide enough to bridge between two or more previous copper metal structures 90a, b (that will become the leads to each end of the TFR, called TFR heads). The ends of each of the patterned trenches extend over a previous copper structure as shown in FIG. 1.

Figure 5:
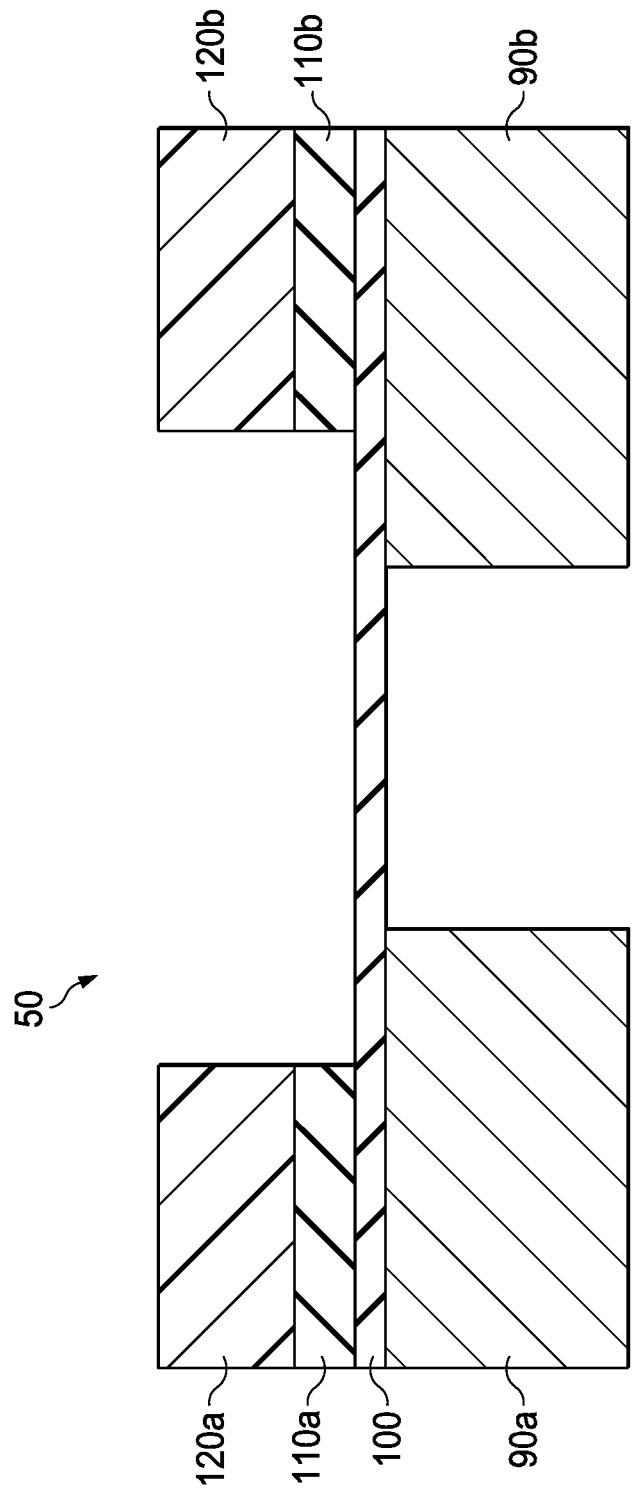
FIG. 5 is a drawing showing an IC stack after portions of a method for building a TFR have been completed according to the teachings of the present disclosure.

FIG. 5 is a drawing showing an IC stack 50 after portions of the method 200 for building a TFR have been completed according to the teachings of the present disclosure. Stack 50 has been etched in a plasma etcher, such as a TEL SCCM Dielectric Etcher, stopping in or on the barrier film 100. Other suitable etchers may be used as long as they are selective enough to remove second dielectric layer 110 without significantly etching barrier layer 100. As shown in FIG. 5, those portions of second layer 110 protected by the photoresist remain after etching (110a, b), while those left exposed have been removed to fully expose barrier layer 100 (e.g., Silicon Nitride or Silicon Carbide) underneath.

FIG. 6 is a drawing showing an IC stack 60 after portions of the method 200 for building a TFR have been completed according to the teachings of the present disclosure. The photoresist 120a and 120b has been removed. In some embodiments, the photoresist may be removed by an in-situ oxygen plasma. Depending on the form of photoresist used, various removal procedures and/or materials may be used. As shown, copper features 90a, b were protected from the stripping step by the dielectric barrier 100.

FIG. 7 is a drawing showing an IC stack 70 after portions of the method 200 for building a TFR have been completed according to the teachings of the present disclosure. As shown in FIG. 7, stack 70 has been etched to remove exposed portions of the dielectric barrier layer 100. The portions of dielectric barrier 100 protected by the hard mask layer 110 were protected from the etching process.

In this example, stack 70 shows that copper features 90a and 90b have been etched in the same process. That is, the depth of the patterned trench not only extends the full depth of second layer 110 and barrier layer 100, but extends some distance into copper features 90a and 90b. The process of etching through the barrier layer 100 patterned the trench and exposed the copper surface where the pattern extended over previously created structures (90a, b). The trench that is created can be referred to as the "TFR trench". The trench depth from the top of the barrier is deeper than the desired thickness of the thin-film resistor. A clean may be performed, such as a diluted HF clean, to remove any etch residue from the surface of the wafer.

Figure 8:
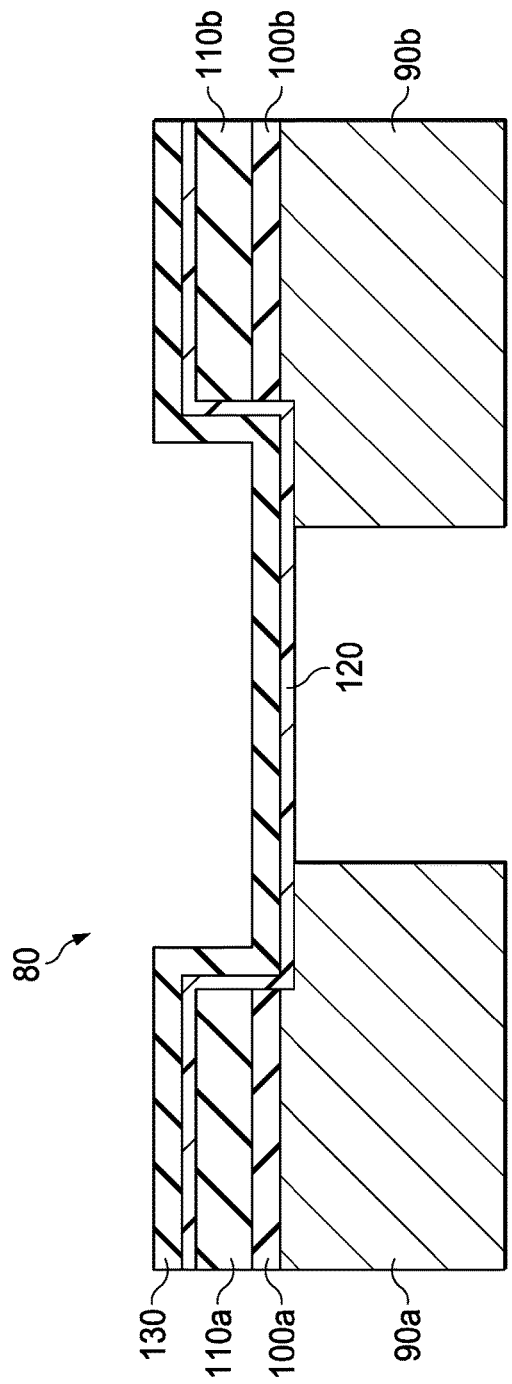
FIG. 8 is a drawing showing an IC stack after portions of a method for building a TFR have been completed according to the teachings of the present disclosure.

FIG. 8 is a drawing showing an IC stack 80 after portions of the method 200 for building a TFR have been completed according to the teachings of the present disclosure. The thin-film resistor material 120 has been deposited into the trench. At this step in method 200, the stack 80 is in a similar condition as the module shown in FIG. 2. The TFR material 120 may comprise a film with desired properties such as robust and stable resistances over a required temperature and/or voltage range, such as TaN or SiCCr. Alternative materials of choice for TFR are: TaNx, CrSi, NiCr, TiNx, SiCr, Ta, Cr, Ti, W, Mo, et al. The TFR material 120 has also been capped with a third dielectric film 130, such as Silicon Dioxide, which may be referred to as the TFR dielectric cap 130.

Figure 9:
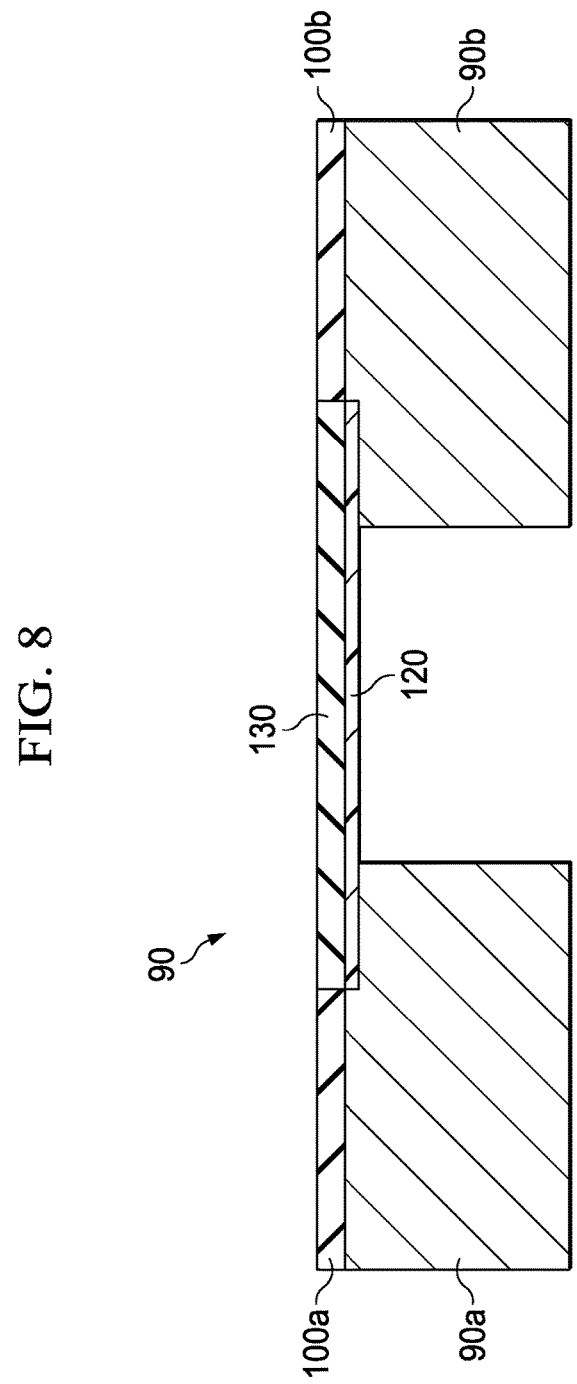
FIG. 9 is a drawing showing an IC stack after portions of a method for building a TFR have been completed according to the teachings of the present disclosure.

FIG. 9 is a drawing showing an IC stack 90 after portions of the method 200 for building a TFR have been completed according to the teachings of the present disclosure. The entire stack 80 from FIG. 8 has been polished at CMP (referred as TFR CMP) to remove portions of dielectric cap 130, TFR material 120, and some or all of the hardmask dielectric material 110 in the protruded portion of the wafer. The TFR CMP process is designed to remove the deposited TFR material outside of the TFR trench, however, stopping in the deposited TFR cap 130 inside the TFR trench. The TFR material 120 in the trench is not affected by the TFR CMP process, and connects the two copper features 90a, b at either end. The remaining TFR module 120 now comprises a thin-film resistor extending between two copper features 90a, b and protected by a dielectric cap 130. The TFR module is completed and the module can be inserted in any Copper layer.

It is then possible to continue processing of the IC device as for a typical Copper interconnect process, such as next level of Via and trench. The TFR module is connected with other part of the circuit using typical Copper via connected to structures 90a and 90b. This eliminates the need of TFR via as used in the PRIOR art (30a and 30b in FIG. 1), and saves one mask layer. The structures 90a and 90b serve as the TFR heads in the TFR module. This eliminates the need to create separate TFR heads, and saves another mask layer.

Figure 10:
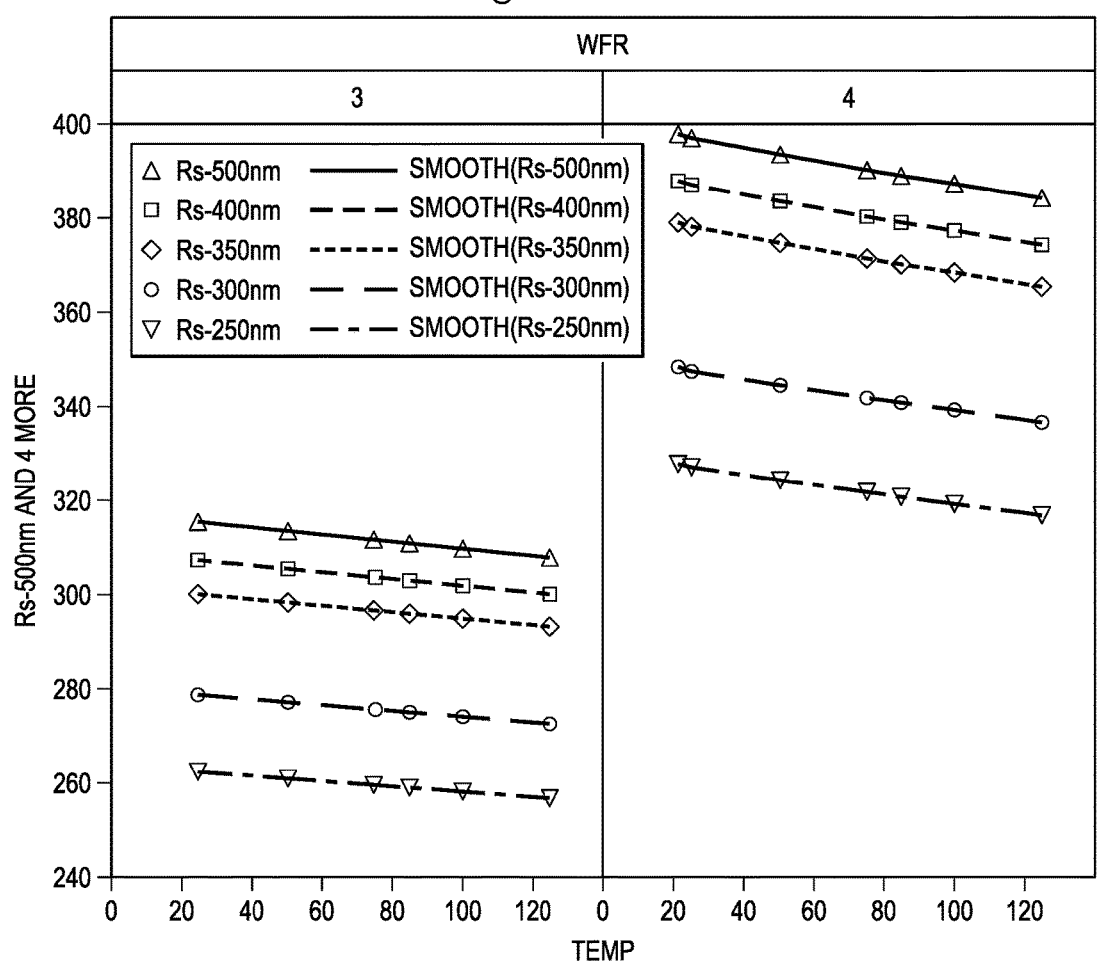
FIG. 10 is a graph showing measurement results of an example TFR built according to teachings of the present disclosure.

FIG. 10 is a graph showing measurement results of an example TFR built according to teachings of the present disclosure. FIG. 10 shows measurement results of a working version of this concept with a sheet resistance of ~200-400Ω/□ and TCR of ~200 ppm/C. FIG. 10 shows the resistance vs. temperature for different wafers.

FIG. 11 is a flowchart showing the example method 200 for manufacturing a thin film resistor after completing a Copper chemical mechanical polishing (CMP) process on a copper process module, according to teachings of the present disclosure. The method 200 may begin with step 210.

Step 210 may include depositing the dielectric barrier 100 after completing a Copper chemical mechanical polishing (CMP) process on a copper process module. Starting after CMP of the copper process, a layer of dielectric barrier 100 (any of the typical barrier dielectrics, SiN, SiC, etc.) may be deposited on the wafer as shown in FIG. 3.

Step 220 may include depositing a second dielectric layer 110 atop the dielectric barrier 100 as a hard mask. Second dielectric layer 110 comprises a different material than the barrier layer 100, as the selectivity between the two layers enables later steps in method 200.

Step 230 may include patterning a trench in the second dielectric layer 110 using photo lithography. The trench bridges between two or more previous copper metal structures (e.g., 90a, b) that will become the leads (TFR heads as 30a or 30b in PRIOR art in FIG. 1) at each end of the TFR once completed. FIG. 4 shows an IC stack 40 after step 230 is complete and a photoresist 120a, b pattern remains as shown.

Step 235 may include cleaning the stack after photo lithography.

Step 240 may include etching the trench through the hard mask and stopping in or on the dielectric barrier. FIG. 5 shows an IC stack 50 after step 240 is complete.

Step 250 may include removing any remaining photoresist from the photo lithography process. The photoresist may be removed by an in-situ oxygen plasma. FIG. 6 shows an IC stack 60 after step 240 is complete.

Step 260 may include etching the trench through the dielectric barrier thereby exposing a surface for each of the at least two copper structures. The trench that is created can be referred to as the "TFR trench". The trench depth from the top of the barrier is deeper than the thickness of the thin-film resistor. A clean is performed, such as a diluted HF clean, to remove etch residue from the surface of the wafer. FIG. 7 shows an IC stack 70 after step 260 is complete.

Step 270 may include depositing thin-film resistor material into the trench, bridging across the resulting at least two exposed Copper surfaces. The material 200 is typically a film that has certain properties that provide robust and stable resistances over a temperature and/or voltage range, such as TaN, SiC, or SiCCr.

Step 280 may include capping the thin-film with a third dielectric film, such as Silicon Dioxide, referred to as the TFR dielectric cap. FIG. 8 shows an IC stack 80 after step 280 is complete.

Step 290 may include polishing off any protruding materials outside TFR trenches, including TFR dielectric cap (130), TFR material (120), some or all of the remaining hardmask (110) with a new CMP process. The CMP process may dig slightly into the TFR trench, removing a portion of the TFR dielectric cap (130). The TFR material remains in the trench, and is connected to a copper lead 90 at each end. FIG. 9 shows an IC stack 90 after step 290 is complete.

Step 300 may include continue the copper Damascene process after the completion of the TFR CMP process to connect the at least two separated copper structures to other structures on the wafer using Copper vias.

Method 200 only requires one mask beyond the normal processes which allows the creation of a copper BEOL in combination with analog transistors that may require such a thin-film resistor.

The invention claimed is:

1. A method for manufacturing a thin film resistor (TFR) after completing a Copper chemical mechanical polishing (CMP) process on a copper process module, the method comprising:
   depositing a dielectric barrier layer across at least two copper structures;
   depositing a second dielectric layer atop the dielectric barrier as a hard mask;
   patterning a trench into a photoresist layer using photo lithography;
   etching the trench through the hard mask and stopping in or on the dielectric barrier;
   removing any remaining photoresist from the photo lithography process;
   etching the trench through the dielectric barrier thereby exposing a copper surface for each of the at least two copper structures; and
   depositing thin-film resistor material into the trench and bridging across the resulting at least two exposed copper surfaces;
   wherein the top surface of the thin-film resistor material is aligned with the top surface of the at least two copper structures.

2. A method for manufacturing a thin film resistor as recited in claim 1, further comprising the step of capping the thin-film with a dielectric film.

3. A method for manufacturing a thin film resistor as recited in claim 2, wherein the dielectric film is silicon dioxide.

4. A method for manufacturing a thin film resistor as recited in claim 1, wherein a cleaning step is performed after the TFR trench etching.

5. A method for manufacturing a thin film resistor as recited in claim 4, wherein the cleaning step is a diluted HF clean configured to remove etch residue from the surface of a wafer.

6. A method for manufacturing a thin film resistor as recited in claim 1, wherein the thin-film material is TaN, SiCr, or SiCCr.

7. A method for manufacturing a thin film resistor as recited in claim 1, wherein the thin-film material is selected from the group consisting of TaNx, CrSi, NiCr, TiNx, SiCr, SiCCr, Ta, Cr, Ti, W, and Mo.

8. A method for manufacturing a thin film resistor as recited in claim 1, further comprising polishing off any protruding materials outside TFR trenches, including TFR dielectric cap, TFR material, and/or some or all of the remaining hard mask with a second CMP process after the thin-film resistor material has been deposited into the trench.

9. A method for manufacturing a thin film resistor as recited in claim 8, further comprising continuing a copper damascene process after the completion of the second CMP to connect the at least two separated copper structures to other structures on a wafer using vias.

* * * * *